(12) United States Patent
Zhang et al.

(10) Patent No.: US 10,153,407 B2
(45) Date of Patent: Dec. 11, 2018

(54) PACKAGING METHOD FOR HIGH GAMUT WHITE LIGHT QUANTUM DOT LED

(71) Applicant: Shenzhen Jufei Optoelectronics Co., Ltd., Shenzhen, Guangdong (CN)

(72) Inventors: Zhikuan Zhang, Guangdong (CN); Qibin Xing, Guangdong (CN); Danpeng Gao, Guangdong (CN); Ni Zhang, Guangdong (CN)

(73) Assignee: Shenzhen Jufei Optoelectronics Co., Ltd. (CN)

( * ) Notice: Subject to any disclaimer, the term of this patent is extended or adjusted under 35 U.S.C. 154(b) by 0 days.

(21) Appl. No.: 15/578,518

(22) PCT Filed: Dec. 20, 2016

(86) PCT No.: PCT/CN2016/110965
§ 371 (c)(1),
(2) Date: Nov. 30, 2017

(87) PCT Pub. No.: WO2017/166871
PCT Pub. Date: Oct. 5, 2017

(65) Prior Publication Data
US 2018/0158996 A1    Jun. 7, 2018

(30) Foreign Application Priority Data
Mar. 30, 2016    (CN) .......................... 2016 1 0192415

(51) Int. Cl.
*H01L 33/50*    (2010.01)
*H01L 33/52*    (2010.01)
(Continued)

(52) U.S. Cl.
CPC ............ *H01L 33/504* (2013.01); *C09K 11/08* (2013.01); *H01L 33/50* (2013.01); *H01L 33/52* (2013.01);
(Continued)

(58) Field of Classification Search
CPC ........ H01L 33/504; H01L 33/50; H01L 33/52
(Continued)

(56) References Cited

U.S. PATENT DOCUMENTS

2009/0321755 A1* 12/2009 Jang ...................... C09K 11/02
257/89
2010/0123155 A1*  5/2010 Pickett .................. B82Y 15/00
257/98
(Continued)

FOREIGN PATENT DOCUMENTS

CN          101100602 A      1/2008
CN          102827599 A     12/2012
(Continued)

OTHER PUBLICATIONS

International Search Report for Application No. PCT/CN2016/110965 dated Mar. 24, 2017.

*Primary Examiner* — Sheikh Maruf
(74) *Attorney, Agent, or Firm* — Lerner, David, Littenberg, Krumholz & Mentlik, LLP

(57) ABSTRACT

A packaging method of high color gamut white light quantum dot (QD) light emitting diodes (LEDs). The method includes: a. add an organic solvent to red light QD phosphor powder and blue light QD phosphor powder, respectively; b. perform ultrasonic processing for the solutions; c. prepare a mixed QD solution; d. add mixed packaging glue to the mixed QD solution; e. remove the organic solvent; f. add green light rare earth phosphor powder; g. drip the mixed phosphor glue into an LED stent fixed with ultraviolet chips, and bake and solidify the LED stent to obtain LED beads. The method produces high gamut white light LEDs and greatly improves the color gamut value of LED backlight beads, which reaches above NTSC 92%. With an organic solvent as a connecting bridge, QDs and the packaging glue are mixed uniformly, QD phosphor powder failure resulted
(Continued)

from agglomeration is avoided, and quality of high color gamut white light LED beads is significantly improved.

10 Claims, 2 Drawing Sheets

(51) Int. Cl.
    *C09K 11/08*     (2006.01)
    *B82Y 20/00*     (2011.01)

(52) U.S. Cl.
    CPC ....... *B82Y 20/00* (2013.01); *H01L 2933/0041* (2013.01); *H01L 2933/0083* (2013.01); *Y10S 977/774* (2013.01); *Y10S 977/95* (2013.01)

(58) Field of Classification Search
    USPC .................................. 438/27–29; 257/98, 99
    See application file for complete search history.

(56) References Cited

U.S. PATENT DOCUMENTS

| | | | |
|---|---|---|---|
| 2011/0068321 A1* | 3/2011 | Pickett | C09K 11/025 257/13 |
| 2011/0068322 A1* | 3/2011 | Pickett | C09K 11/02 257/13 |
| 2014/0049155 A1* | 2/2014 | Kurtin | H01L 33/502 313/512 |
| 2014/0103384 A1* | 4/2014 | Takigawa | H01L 33/502 257/98 |
| 2014/0119026 A1* | 5/2014 | Davis | F21V 7/22 362/296.02 |
| 2014/0254131 A1* | 9/2014 | Osinski | B82Y 20/00 362/84 |
| 2014/0339499 A1* | 11/2014 | Tu | C09K 11/02 257/13 |
| 2015/0028365 A1* | 1/2015 | Kurtin | H01L 33/501 257/88 |
| 2016/0290573 A1* | 10/2016 | Allen | F21K 9/233 |

FOREIGN PATENT DOCUMENTS

| | | |
|---|---|---|
| CN | 104650848 A | 5/2015 |
| CN | 105112044 A | 12/2015 |
| CN | 105870302 A | 8/2016 |

* cited by examiner

PACKAGING METHOD FOR HIGH GAMUT WHITE LIGHT QUANTUM DOT LED

CROSS REFERENCE TO RELATED APPLICATIONS

The present application is a national phase entry under 35 U.S.C. § 371 of International Application No. PCT/CN2016/110965, filed Dec. 20, 2016, which claims priority from Chinese Patent Application No. 201610192415.2 filed Mar. 30, 2016, all of which are hereby incorporated herein by reference.

TECHNICAL FIELD

The present invention relates to the technical field of white light LED backlight, and in particular relates to a packaging method of high color gamut white light QD LEDs.

BACKGROUND ART

With the continuous progresses in science and technology, LED backlight is gradually becoming a leading backlight source. Compared with the traditional CCFL backlight source, LED backlight has many advantages such as high color gamut, high luminance, long service life, energy conservation, and real-time controllable color. Especially, a high color gamut LED backlight source makes the screen of electronic products using it such as TV sets, mobile phones, and panel computers have chromatic colors and a high color reduction degree.

Currently, the common LED backlight source usually uses blue light chips to excite YAG yellow light phosphor powder. Since the backlight source lacks a red light component, the color gamut value can be up to only NTSC 65% to 72%. To further improve the color gamut value, technicians generally use blue light chips to excite both red light phosphor powder and green light phosphor powder. However, since the full width at half maximum (FWHM) of the phosphor powder used currently is large, the color gamut value of the backlight source can be increased to NTSC 80% or so, even if blue light chips are used to excite both red light phosphor powder and green light phosphor powder. In addition, considering that the excitation efficiency of current phosphor powder is low, a lot of phosphor powder needs to be used to realize high color gamut white light. As a result, the concentration (ratio of phosphor powder to packaging glue) of phosphor powder is very high during LED packaging. This greatly increases the difficulty of packaging operations and the reject ratio of products.

In recent years, attention has gradually been paid to QD materials, and especially QD phosphor powder has widely been concerned in the LED backlight industry for a series of unique optical properties, such as adjustable spectrum (as the grain size is adjusted), small FWHM of emission peak, large Stokes shift, and high excitation efficiency. Currently, QD phosphor powder is used to realize high color gamut white light in the following ways: (1) make QD phosphor powder into an optical film, fill it in a light guide panel or paste it in an LCD screen, and obtain high color gamut white light through the excitation of blue light or ultraviolet light backlight beads; (2) make QD phosphor powder into glass tubes, put them on the sides of the screen, and obtain high color gamut white light through the excitation of blue light or ultraviolet light backlight beads. However, it is very difficult for these two realization modes to realize the large-scale industrialization because of complex processes, a low photo transformation efficiency, and a high cost. For this reason, researchers have attempted to package QD phosphor powder in LED beads to obtain high color gamut white light. However, QD phosphor powder is difficult to mix with packaging glue and is easy to agglomerate to fail, and included impurities destroy packaging glue so that package glue is difficult to solidify. In view of these technical difficulties, no substantial progress has been made in the research.

SUMMARY OF THE INVENTION

To solve the above-mentioned technical problems, a packaging method of high color gamut white light QD LEDs, where QDs are easy to mix with packaging glue and difficult to agglomerate to fail, and impurities are difficult to go into QDs, is put forward in the present invention.

To solve the above-mentioned technical problem, the following technical solution is adopted for the present invention:

The present invention provides a packaging method of high color gamut white light QD LEDs and the method comprises the following steps:

a. add 50 to 2000 parts by weight of an organic solvent to 1 part by weight of red light QD phosphor powder to obtain a red light QD solution, and add 50 to 1500 parts by weight of an organic solvent to 1 part by weight of blue light QD phosphor powder to obtain a blue light QD solution;

b. perform ultrasonic processing respectively for said red light QD solution and blue light QD solution to obtain clear QD solutions;

c. add 1 to 50 parts by weight of the blue light QD solution to 1 part by weight of the red light QD solution to obtain a mixed QD solution;

d. add 3 to 800 parts by weight of mixed packaging glue to 1 part by weight of the mixed QD solution and mix them well;

e. mix the mixture obtained in step d in vacuum for deaeration to remove the organic solvent from the mixed solution obtained in step d and obtain a uniformly mixed red light and blue light QD phosphor glue;

f. add green light rare earth phosphor powder to said mixed QD phosphor glue according to a mass ratio of 1-50:1 between the green light rare earth phosphor powder and red light QD phosphor powder, and mix them;

g. drip the mixed phosphor glue obtained in step f into an LED stent fixed with ultraviolet chips, and bake and solidify the LED stent to obtain LED beads.

Preferably, said organic solvent is at least one of n-hexane, cyclohexane, n-octane, methylbenzene, dichlorotoluene, dichloromethane, trichlormethane, and pyridine.

Preferably, said red light QD phosphor powder and blue light QD phosphor powder are both selected from at least one of BaS, $AgInS_2$, NaCl, $Fe_2O_3$, $In_2O_3$, InAs, InN, InP, CdS, CdSe, CdTe, ZnS, ZnSe, ZnTe, GaAs, GaN, GaS, GaSe, InGaAs, MgS, MgSe, MgTe, PbS, PbSe, PbTe, $Cd(S_xSe_{1-x})$, $BaTiO_3$, $PbZrO_3$, $CsPbCl_3$, $CsPbBr_3$, and $CsPbI_3$.

Preferably, the grain size of said red light QD phosphor powder and said blue light QD phosphor powder is 1 nm to 10 nm and the grain size of said red light QD phosphor powder is greater than the grain size of said blue light QD phosphor powder; the peak wavelength of the light emitted from said red light QD phosphor powder is 600 nm to 660 nm, and the peak wavelength of the light emitted from said blue light QD phosphor powder is 430 nm to 480 nm.

Preferably, said mixed packaging glue consists of packaging glue A and packaging glue B at a mass ratio of 1:1-20, and said packaging glue A and packaging glue B are both one of epoxy packaging glue, organic silicon packaging glue, and polyurethane packaging glue.

Preferably, said green light rare earth phosphor powder is selected from one of rare earth element doped silicate, aluminate, phosphate, nitride, and fluoride phosphor powders, the peak wavelength of the light emitted from said green light rare earth phosphor powder is 520 nm to 550 nm, and the peak wavelength of the light emitted from said ultraviolet chips is 230 nm to 395 nm.

Preferably, the frequency of the ultrasonic wave is 15 KHz to 120 KHz, the ultrasonic duration is 10 min to 90 min, and the water bath temperature during ultrasonic processing is 25° C. to 45° C. in step b; the baking temperature is 120° C. to 180° C., and the baking duration is 0.5 h to 6 h in step g.

Preferably, the mixing speed is 120 rpm to 350 rpm and the mixing duration is 5 min to 30 min in step d.

Preferably, the pressure in the deaerator during vacuum deaeration mixing is 0 KPa to 0.15 KPa, the mixing speed is 300 rpm to 1200 rpm, the deaeration temperature is 40° C. to 55° C., the deaeration duration is 30 min to 150 min in step e.

Preferably, the mixture is put into the deaerator and is mixed uniformly after a green light rare earth phosphor powder is added, the pressure in said deaerator is 0 KPa to 1.5 KPa, the mixing speed is 1100 rpm to 2000 rpm, the mixing duration is 3 min to 10 min, and the mixing temperature is 25° C. to 55° C. in step f.

Compared with the prior art, the above-mentioned technical solution of the present invention has the following advantages:

(1) In the packaging method of high color gamut white light QD LEDs in the present invention, the phosphor glue obtained by combining red light and blue light QD phosphor powders with green light rare earth phosphor powder is packaged in the LED stent fixed with ultraviolet chips to obtain high color gamut white light LEDs and the color gamut value of LED backlight beads is greatly increased to above NTSC 92%.

(2) In the packaging method of high color gamut white light QD LEDs in the present invention, since the excitation efficiencies of red light and blue light QD phosphor powders are high, the concentration of phosphor powders used in the packaging process is low. The packaging method reduces the difficulty of packaging operation and the reject ratio of products and is applicable to mass industrial production.

(3) In the packaging method of high color gamut white light QD LEDs in the present invention, red light and blue light QD phosphor powders are respectively dissolved in an organic solvent. With an organic solvent as a connecting bridge, QDs and the packaging glue are mixed uniformly, QD phosphor powder failure resulted from agglomeration is avoided, and the quality of high color gamut white light LED beads is significantly improved.

(4) In the packaging method of high color gamut white light QD LEDs in the present invention, after QD phosphor powder is uniformly mixed with packaging glue, the organic solvent is removed from packaging glue through vacuum deaeration, and intoxication and packaging glue solidification failure resulted from the influence of the organic solvent are avoided. Thus, the technical bottleneck of packaging of QD phosphor powder is solved and the reliability of high color gamut white light LED beads is greatly improved.

BRIEF DESCRIPTION OF THE DRAWINGS

To help you to more easily understand the present invention clearly, the following further describes the present invention on the basis of specific embodiments and the drawings of the present invention, wherein.

DESCRIPTION OF REFERENCE NUMBERS IN THE DRAWINGS

1—Stent; 2—Ultraviolet chip; 3—Bonding wire; 4—Red light QD phosphor powder; 5—Blue light QD phosphor powder; 6—Green light rare earth phosphor powder; 7—Packaging glue

DETAILED DESCRIPTION OF THE INVENTION

Embodiment 1

Figure 1:
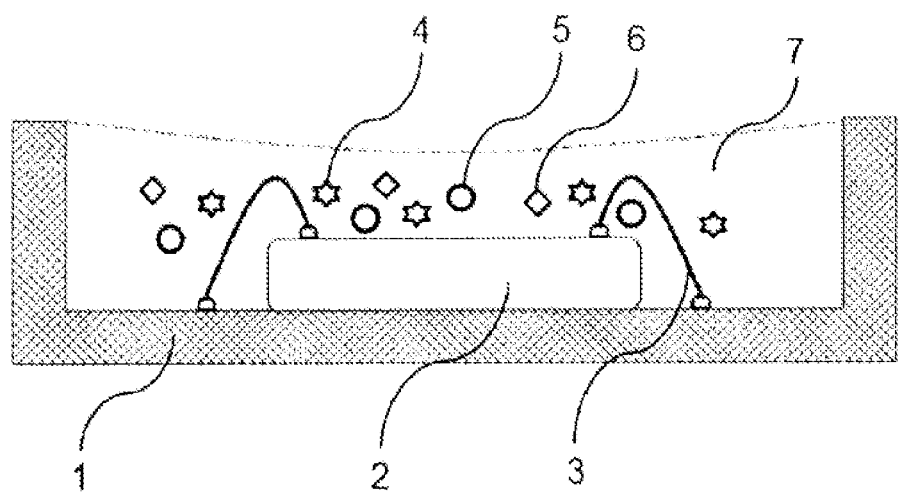
FIG. 1 shows the structure of the LED beads obtained by using the packaging method described in embodiment 1 of the present invention.

The present embodiment provides a packaging method of high color gamut white light QD LEDs and the method comprises the following steps:

a. add 50 parts by weight of the organic solvent n-hexane to 1 part by weight of BaS red light QD phosphor powder which emits light with a peak wavelength of 600 nm to obtain a red light QD solution; add 50 parts by weight of the organic solvent cyclohexane to 1 part by weight of $AgInS_2$ blue light QD phosphor powder which emits light with a peak wavelength of 430 nm to obtain a blue light QD solution, wherein said red light QD phosphor powder and blue light QD phosphor powder are both commercially available phosphor powders, the grain size of the red light QD phosphor powder is 6 nm, and the grain size of the blue light QD phosphor powder is 4 nm;

b. perform ultrasonic processing at a water bath temperature of 25° C. and at a frequency of 15 KHz for 10 min respectively for said red light QD solution and blue light QD solution to obtain clear QD solutions;

c. add 1 part by weight of the blue light QD solution to 1 part by weight of the red light QD solution to obtain a mixed QD solution;

d. add 3 parts by weight of mixed packaging glue to 1 part by weight of the mixed QD solution, put them in a magnetic mixer, and mix them at a mixing speed of 120 rpm for 5 min until they are mixed uniformly, wherein said mixed packaging glue consists of epoxy packaging glue A and epoxy packaging glue B at a mass ratio of 1:1;

e. deaerate the mixture obtained in step d to remove the organic solvents n-hexane and cyclohexane and obtain a uniformly mixed QD phosphor glue, wherein deaeration is performed in a vacuum deaerator, the pressure in the deaerator is 0.1 KPa, the mixing speed is 300 rpm, the deaeration temperature is 40° C., and the deaeration duration is 30 min;

f. add rare earth element doped silicate green light phosphor powder to said mixed QD phosphor glue according to a mass ratio of 1:1 between the green light rare earth phosphor powder and red light QD phosphor powder, and mix them for 5 min until green light phosphor powder is mixed into the mixed QD phosphor glue to obtain a red light, blue light, and green light mixed phosphor glue, wherein the peak wavelength of the light emitted from said green light rare earth phosphor powder is 520 nm, the green light phosphor powder and the mixed QD phosphor glue are mixed uniformly in the vacuum deaerator, the pressure in the deaerator is 0.5 KPa, the mixing speed is 1100 rpm, the mixing duration is 3 min, the mixing temperature in the deaerator is 25° C.;

g. drip the mixed phosphor glue obtained in step f into an LED stent fixed with ultraviolet chips which emit light of 230 nm peak wavelength and connected with bonding wires which can be gold, silver, copper or other conductive alloys, put the LED stent in an oven, and bake and solidify the LED stent at a temperature of 120° C. for 0.5 h to obtain high color gamut white light LED beads, wherein the structure of said high color gamut white light LED beads is shown in FIG. 1, said red light QD phosphor powder (4), green light rare earth phosphor powder (6), and blue light QD phosphor powder (5) are distributed in the packaging glue (7), said packaging glue (7) is packaged around the ultraviolet chip (2), the bonding wires (3) can be gold, silver, copper, or other conductive alloys, and the peak wavelength of the light emitted from said ultraviolet chip (2) is 230 nm.

Embodiment 2

The present embodiment provides a packaging method of high color gamut white light QD LEDs and the method comprises the following steps:

a. add 2000 parts by weight of the organic solvent n-octane to 1 part by weight of NaCl and $In_2O_3$ red light QD phosphor powder which emits light with a peak wavelength of 660 nm to obtain a red light QD solution; add 1500 parts by weight of the organic solvents methylbenzene and dichlorotoluene to 1 part by weight of InAS and InN blue light QD phosphor powder which emits light with a peak wavelength of 480 nm to obtain a blue light QD solution, wherein the grain size of said red light QD phosphor powder is 8 nm, the grain size of said blue light QD phosphor powder is 3 nm, and said red light QD phosphor powder and blue light QD phosphor powder are both commercially available phosphor powders;

b. perform ultrasonic processing at a water bath temperature of 45° C. and at a frequency of 120 KHz for 90 min respectively for said red light QD solution and blue light QD solution to obtain clear QD solutions;

c. add 50 parts by weight of the blue light QD solution to 1 part by weight of the red light QD solution to obtain a mixed QD solution;

d. add 800 parts by weight of mixed packaging glue to 1 part by weight of the mixed QD solution, put them in a magnetic mixer, and mix them at a mixing speed of 350 rpm for 30 min until they are mixed uniformly, wherein said mixed packaging glue consists of organic silicon packaging glue A and epoxy packaging glue B at a mass ratio of 1:20;

e. deaerate the mixture obtained in step d to remove the organic solvents n-octane, methylbenzene, and dichlorotoluene and obtain a uniformly mixed QD phosphor glue, wherein deaeration is performed in a vacuum deaerator, the pressure in the deaerator is 0.15 KPa, the mixing speed is 1200 rpm, the deaeration temperature is 55° C., and the deaeration duration is 150 min;

f. add rare earth element doped phosphate green light phosphor powder to said mixed QD phosphor glue according to a mass ratio of 50:1 between the green light rare earth phosphor powder and red light QD phosphor powder, and mix them for 8 min until green light phosphor powder is mixed into the mixed QD phosphor glue to obtain a red light, blue light, and green light mixed phosphor glue, wherein the peak wavelength of the light emitted from said green light rare earth phosphor powder is 550 nm, the green light rare earth phosphor powder and the mixed QD phosphor glue are mixed uniformly in the vacuum deaerator, the pressure in the deaerator is 1.5 KPa, the mixing speed is 2000 rpm, the mixing duration is 10 min, the mixing temperature in the deaerator is 55° C.;

g. drip the mixed phosphor glue obtained in step f into an LED stent fixed with ultraviolet chips and connected with bonding wires, put the LED stent in an oven, and bake and solidify the LED stent at a temperature of 180° C. for 6 h to obtain high color gamut white light LED beads, wherein the material of bonding wires can be gold, silver, copper, or other conductive alloys, and the peak wavelength of the light emitted from said ultraviolet chip is 395 nm.

Embodiment 3

The present embodiment provides a packaging method of high color gamut white light QD LEDs and the method comprises the following steps:

a. add 150 parts by weight of the organic solvent dichloromethane to 1 part by weight of InP, CdS, and CdSe red light QD phosphor powder which emits light with a peak wavelength of 620 nm to obtain a red light QD solution; add 50 parts by weight of the organic solvent trichlormethane to 1 part by weight of CdTe, ZnS, and ZnSe blue light QD phosphor powder which emits light with a peak wavelength of 450 nm to obtain a blue light QD solution, wherein said red light QD phosphor powder and blue light QD phosphor powder are both commercially available phosphor powders, the grain size of the red light QD phosphor powder is 6 nm, and the grain size of the blue light QD phosphor powder is 3 nm;

b. perform ultrasonic processing at a water bath temperature of 35° C. and at a frequency of 25 KHz for 40 min respectively for said red light QD solution and blue light QD solution to obtain clear QD solutions;

c. add 20 parts by weight of the blue light QD solution to 1 part by weight of the red light QD solution to obtain a mixed QD solution;

d. add 30 parts by weight of mixed packaging glue to 1 part by weight of the mixed QD solution, put them in a magnetic mixer, and mix them at a mixing speed of 220 rpm for 15 min until they are mixed uniformly, wherein said mixed packaging glue consists of organic silicon packaging glue A and polyurethane packaging glue B at a mass ratio of 1:10;

e. deaerate the mixture obtained in step d to remove the organic solvents dichlormethane and trichlormethane and obtain a uniformly mixed QD phosphor glue, wherein deaeration is performed in a vacuum deaerator, the pressure in the deaerator is 0.05 KPa, the mixing speed is 600 rpm, the deaeration temperature is 43° C., and the deaeration duration is 50 min;

f. add rare earth element doped nitride green light phosphor powder to said mixed QD phosphor glue according to a mass ratio of 10:1 between the green light rare earth phosphor powder and red light QD phosphor powder, and mix them for 8 min until green light phosphor powder is mixed into the mixed QD phosphor glue to obtain a red light, blue light, and green light mixed phosphor glue, wherein the peak wavelength of the light emitted from said green light rare earth phosphor powder is 530 nm, the green light rare earth phosphor powder and the mixed QD phosphor glue are mixed uniformly in the vacuum deaerator, the pressure in the deaerator is 0.8 KPa, the mixing speed is 1700 rpm, the mixing duration is 6 min, the mixing temperature in the deaerator is 35° C.;

g. drip the mixed phosphor glue obtained in step f into an LED stent fixed with ultraviolet chips and connected with bonding wires, put the LED stent in an oven, and bake and solidify the LED stent at a temperature of 140° C. for 2 h to obtain high color gamut white light LED beads, wherein the material of bonding wires can be gold, silver, copper, or other conductive alloys, and the peak wavelength of the light emitted from said ultraviolet chip is 260 nm.

Embodiment 4

The present embodiment provides a packaging method of high color gamut white light QD LEDs and the method comprises the following steps:

a. add 350 parts by weight of the organic solvent n-hexane to 1 part by weight of ZnTe and GaAs red light QD phosphor powder which emits light with a peak wavelength of 625 nm to obtain a red light QD solution; add 800 parts by weight of the organic solvent cyclohexane to 1 part by weight of GaN, GaS, GaSe, and InGaAs blue light QD phosphor powder which emits light with a peak wavelength of 445 nm to obtain a blue light QD solution, wherein the grain size of said red light QD phosphor powder is 5 nm, the grain size of said blue light QD phosphor powder is 1 nm, and said red light QD phosphor powder and blue light QD phosphor powder are both commercially available phosphor powders;

b. perform ultrasonic processing at a water bath temperature of 40° C. and at a frequency of 110 KHz for 80 min respectively for said red light QD solution and blue light QD solution to obtain clear QD solutions;

c. add 1 part by weight of the blue light QD solution to 1 part by weight of the red light QD solution to obtain a mixed QD solution;

d. add 620 parts by weight of mixed packaging glue to 1 part by weight of the mixed QD solution, put them in a magnetic mixer, and mix them at a mixing speed of 180 rpm for 25 min until they are mixed uniformly, wherein said mixed packaging glue consists of epoxy packaging glue A and polyurethane packaging glue B at a mass ratio of 1:9;

e. deaerate the mixture obtained in step d to remove the organic solvents n-hexane and cyclohexane and obtain a uniformly mixed QD phosphor glue, wherein deaeration is performed in a vacuum deaerator, the pressure in the deaerator is 0.12 KPa, the mixing speed is 1000 rpm, the deaeration temperature is 50° C., and the deaeration duration is 40 min;

f. add rare earth element doped fluoride green light phosphor powder to said mixed QD phosphor glue according to a mass ratio of 15:1 between the green light rare earth phosphor powder and red light QD phosphor powder, and mix them uniformly to obtain a red light, blue light, and green light mixed phosphor glue, wherein the peak wavelength of the light emitted from said green light phosphor powder is 535 nm, the green light rare earth phosphor powder and the mixed QD phosphor glue are mixed uniformly in the vacuum deaerator, the pressure in the deaerator is 0.2 KPa, the mixing speed is 1350 rpm, the mixing duration is 9 min, the mixing temperature in the deaerator is 35° C.;

g. drip the mixed phosphor glue obtained in step f into an LED stent fixed with ultraviolet chips and connected with bonding wires, put the LED stent in an oven, and bake and solidify the LED stent at a temperature of 130° C. for 1 h to obtain high color gamut white light LED beads, wherein the material of bonding wires can be gold, silver, copper, or other conductive alloys, and the peak wavelength of the light emitted from said ultraviolet chip is 235 nm.

Embodiment 5

The present embodiment provides a packaging method of high color gamut white light QD LEDs and the method comprises the following steps:

a. add 60 parts by weight of the organic solvent pyridine to 1 part by weight of MgS, MgSe, and MgTe red light QD phosphor powder which emits light with a peak wavelength of 610 nm to obtain a red light QD solution; add 65 parts by weight of the organic solvent cyclohexane to 1 part by weight of PbS and PbSe blue light QD phosphor powder which emits light with a peak wavelength of 470 nm to obtain a blue light QD solution, wherein said red light QD phosphor powder and blue light QD phosphor powder are both commercially available phosphor powders, the grain size of the red light QD phosphor powder is 4 nm, and the grain size of the blue light QD phosphor powder is 2 nm;

b. perform ultrasonic processing at a water bath temperature of 30° C. and at a frequency of 110 KHz for 20 min respectively for said red light QD solution and blue light QD solution to obtain clear QD solutions;

c. add 1 part by weight of the blue light QD solution to 30 part by weight of the red light QD solution to obtain a mixed QD solution;

d. add 5 parts by weight of mixed packaging glue to 1 part by weight of the mixed QD solution, put them in a magnetic mixer, and mix them at a mixing speed of 130 rpm for 25 min until they are mixed uniformly, wherein said mixed packaging glue consists of polyurethane packaging glue A and epoxy packaging glue B at a mass ratio of 1:15;

e. deaerate the mixture obtained in step d to remove the organic solvents pyridine and cyclohexane and obtain a uniformly mixed QD phosphor glue, wherein deaeration is performed in a vacuum deaerator, the pressure in the deaerator is 0.05 KPa, the mixing speed is 800 rpm, the deaeration temperature is 52° C., and the deaeration duration is 130 min;

f. add rare earth element doped aluminate green light phosphor powder to said mixed QD phosphor glue and mix them for 7 min until green light phosphor powder is mixed into the mixed QD phosphor glue to obtain a red light, blue light, and green light mixed phosphor glue, wherein the peak wavelength of the light emitted from said green light rare earth phosphor powder is 545 nm, the green light rare earth phosphor powder and the mixed QD phosphor glue are mixed uniformly in the vacuum deaerator, the pressure in the deaerator is 1.2 KPa, the mixing speed is 1900 rpm, the mixing duration is 4 min, the mixing temperature in the deaerator is 40° C.;

g. drip the mixed phosphor glue obtained in step f into an LED stent fixed with ultraviolet chips and connected with bonding wires, put the LED stent in an oven, and bake and solidify the LED stent at a temperature of 145° C. for 4.5 h to obtain high color gamut white light LED beads, wherein the material of bonding wires can be gold, silver, copper, or other conductive alloys, and the peak wavelength of the light emitted from said ultraviolet chip is 330 nm.

Embodiment 6

The present embodiment provides a packaging method of high color gamut white light QD LEDs and the method comprises the following steps:

a. add 1750 parts by weight of the organic solvent methylbenzene to 1 part by weight of PbTe, Cd ($S_xSe_{1-x}$), and $BaTiO_3$ red light QD phosphor powder which emits light with a peak wavelength of 645 nm to obtain a red light QD solution; add 1350 parts by weight of the organic solvent dichloromethane to 1 part by weight of $PbZrO_3$, $CsPbCl_3$, and $CsPbBr_3$ blue light QD phosphor powder which emits light with a peak wavelength of 450 nm to obtain a blue light QD solution, wherein said red light QD phosphor powder and blue light QD phosphor powder are both commercially available phosphor powders, the grain size of the red light QD phosphor powder is 10 nm, and the grain size of the blue light QD phosphor powder is 8 nm;

b. perform ultrasonic processing at a water bath temperature of 25° C. and at a frequency of 105 KHz for 35 min respectively for said red light QD solution and blue light QD solution to obtain clear QD solutions;

c. add 9 parts by weight of the blue light QD solution to 1 part by weight of the red light QD solution to obtain a mixed QD solution;

d. add 17 parts by weight of mixed packaging glue to 1 part by weight of the mixed QD solution, put them in a magnetic mixer, and mix them at a mixing speed of 225 rpm for 26 min until they are mixed uniformly, wherein said mixed packaging glue consists of polyurethane packaging glue A and polyurethane packaging glue B at a mass ratio of 1:5;

e. deaerate the mixture obtained in step d to remove the organic solvents methylbenzene and dichloromethane and obtain a uniformly mixed QD phosphor glue, wherein deaeration is performed in a vacuum deaerator, the pressure in the deaerator is 0.10 KPa, the mixing speed is 600 rpm, the deaeration temperature is 42° C., and the deaeration duration is 140 min;

f. add rare earth element doped fluoride green light phosphor powder to said mixed QD phosphor glue according to a mass ratio of 24:1 between the green light rare earth phosphor powder and red light QD phosphor powder, and mix them for 6 min until green light phosphor powder is mixed into the mixed QD phosphor glue to obtain a red light, blue light, and green light mixed phosphor glue, wherein the peak wavelength of the light emitted from said green light rare earth phosphor powder is 545 nm, the green light rare earth phosphor powder and the mixed QD phosphor glue are mixed uniformly in the vacuum deaerator, the pressure in the deaerator is 1.2 KPa, the mixing speed is 1450 rpm, the mixing duration is 7 min, the mixing temperature in the deaerator is 40° C.;

g. drip the mixed phosphor glue obtained in step f into an LED stent fixed with ultraviolet chips and connected with bonding wires, put the LED stent in an oven, and bake and solidify the LED stent at a temperature of 145° C. for 5.5 h to obtain high color gamut white light LED beads, wherein the material of bonding wires can be gold, silver, copper, or other conductive alloys, and the peak wavelength of the light emitted from said ultraviolet chip is 330 nm.

Embodiment 7

The present embodiment provides a packaging method of high color gamut white light QD LEDs and the method comprises the following steps:

a. add 550 parts by weight of the organic solvent pyridine to 1 part by weight of $CsPbI_3$ red light QD phosphor powder which emits light with a peak wavelength of 623 nm to obtain a red light QD solution; add 850 parts by weight of the organic solvent n-octane to 1 part by weight of NaCl and $Fe_2O_3$ blue light QD phosphor powder which emits light with a peak wavelength of 465 nm to obtain a blue light QD solution, wherein said red light QD phosphor powder and blue light QD phosphor powder are both commercially available phosphor powders, the grain size of the red light QD phosphor powder is 9 nm, and the grain size of the blue light QD phosphor powder is 5 nm;

b. perform ultrasonic processing at a water bath temperature of 35° C. and at a frequency of 105 KHz for 56 min respectively for said red light QD solution and blue light QD solution to obtain clear QD solutions;

c. add 21 parts by weight of the blue light QD solution to 1 part by weight of the red light QD solution to obtain a mixed QD solution;

d. add 560 parts by weight of mixed packaging glue to 1 part by weight of the mixed QD solution, put them in a magnetic mixer, and mix them at a mixing speed of 145 rpm for 20 min until they are mixed uniformly, wherein said mixed packaging glue consists of epoxy packaging glue A and epoxy packaging glue B at a mass ratio of 1:15;

e. deaerate the mixture obtained in step d to remove the organic solvents pyridine, trichlormethane, and n-octane and obtain a uniformly mixed QD phosphor glue, wherein deaeration is performed in a vacuum deaerator, the pressure in the deaerator is 0.12 KPa, the mixing speed is 760 rpm, the deaeration temperature is 44° C., and the deaeration duration is 125 min;

f. add rare earth element doped silicate green light phosphor powder to said mixed QD phosphor glue according to a mass ratio of 40:1 between the green light rare earth phosphor powder and red light QD phosphor powder, and mix them for 9 min until green light phosphor powder is mixed into the mixed QD phosphor glue to obtain a red light, blue light, and green light mixed phosphor glue, wherein the peak wavelength of the light emitted from said green light rare earth phosphor powder is 534 nm, the green light phosphor powder and the mixed QD phosphor glue are mixed uniformly in the vacuum deaerator, the pressure in the deaerator is 1.1 KPa, the mixing speed is 1600 rpm, the mixing duration is 6 min, the mixing temperature in the deaerator is 50° C.;

g. drip the mixed phosphor glue obtained in step e into an LED stent fixed with ultraviolet chips and connected with bonding wires, put the LED stent in an oven, and bake and solidify the LED stent at a temperature of 160° C. for 3.5 h to obtain high color gamut white light LED beads, wherein the material of bonding wires can be gold, silver, copper, or other conductive alloys, and the peak wavelength of the light emitted from said ultraviolet chip is 345 nm.

Experimental Example

Test the chromaticity coordinates and color gamut values of the LED beads obtained by using the packaging methods of high color white light QD LEDs in embodiments 1 to 7. Table 1 lists the test results.

TABLE 1

| | Embodiment 1 | Embodiment 2 | Embodiment 3 | Embodiment 4 | Embodiment 5 | Embodiment 6 | Embodiment 7 |
|---|---|---|---|---|---|---|---|
| Chromaticity coordinates | (0.29, 0.27) | (0.31, 0.30) | (0.32, 0.29) | (0.27, 0.25) | (0.29, 0.26) | (0.28, 0.27) | (0.30, 0.27) |
| NTSC color gamut value | 93.4% | 92.8% | 95.5% | 93.0% | 92.2% | 96.1% | 93.8% |

The above results show that the color of the light emitted from the LED beads obtained by using the methods in embodiments 1 to 7 is in the white light zone and has a high color gamut value, which is above 92%.

Figure 2:
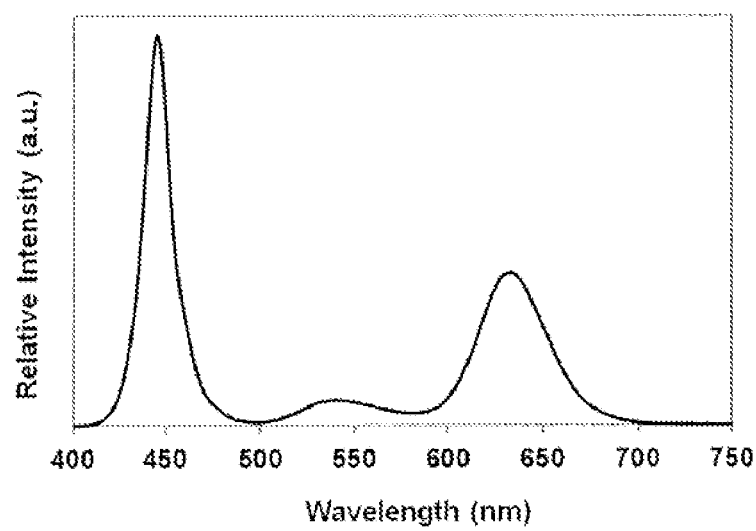
FIG. 2 shows the spectrum of light emitted from the LED beads obtained by using the packaging method described in embodiment 4 of the present invention.
Figure 3:
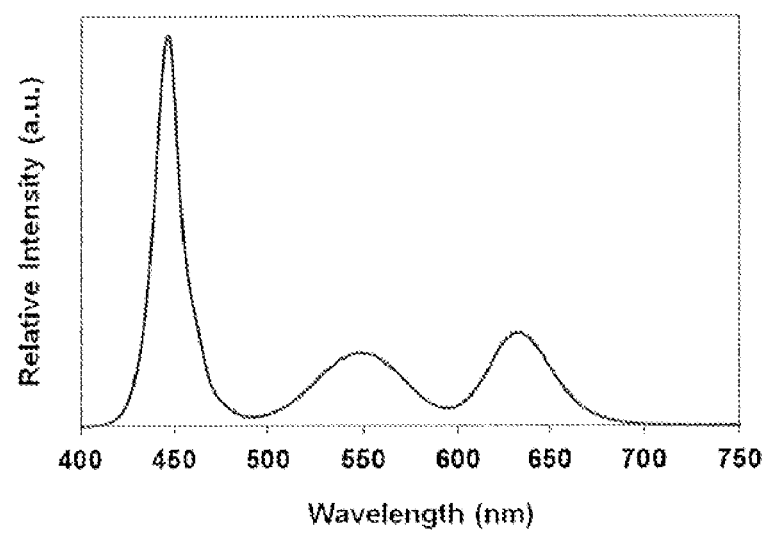
FIG. 3 shows the spectrum of light emitted from the LED beads obtained by using the packaging method described in embodiment 6 of the present invention.

FIG. 2 and FIG. 3 show the spectra of the light emitted from the LED beads obtained by using the packaging methods of high color gamut white light QD LEDs in embodiments 4 and 6. The results show that white light with high color purity and a high color gamut can be obtained after the red light emitted from red light QD phosphor powder, the blue light emitted from blue light QD phosphor powder, and the green light emitted from the green light rare earth phosphor powder under the excitation of ultraviolet chips are mixed.

Obviously, the embodiments above are only the examples given to clearly describe the present invention, but are not used to limit the implementation modes of the present invention. Those skilled in the art can make variations or modifications in different forms on the basis of the description above. It is unnecessary and also impossible to enumerate all implementation modes of the present invention here. All variations or modifications obviously derived from the present invention should still fall within the protection scope of the present invention.

The invention claimed is:

1. A packaging method of high color gamut white light QD LEDs, the method comprising the following steps:
   a. add 50 to 2000 parts by weight of an organic solvent to 1 part by weight of red light QD phosphor powder to obtain a red light QD solution, and add 50 to 1500 parts by weight of an organic solvent to 1 part by weight of blue light QD phosphor powder to obtain a blue light QD solution;
   b. perform ultrasonic processing respectively for said red light QD solution and blue light QD solution to obtain clear QD solutions;
   c. add 1 to 50 parts by weight of the blue light QD solution to 1 part by weight of the red light QD solution to obtain a mixed QD solution;
   d. add 3 to 800 parts by weight of mixed packaging glue to 1 part by weight of the mixed QD solution and mix them well;
   e. mix the mixture obtained in step d in vacuum for deaeration to remove the organic solvent from the mixed solution obtained in step d and obtain a uniformly mixed red light and blue light QD phosphor glue;
   f. add green light rare earth phosphor powder to said mixed QD phosphor glue according to a mass ratio of 1-50:1 between the green light rare earth phosphor powder and red light QD phosphor powder, and mix them;
   g. drip the mixed phosphor glue obtained in step f into an LED stent fixed with ultraviolet chips, and bake and solidify the LED stent to obtain LED beads.

2. The packaging method of high color gamut white light QD LEDs according to claim 1, wherein said organic solvent is at least one of n-hexane, cyclohexane, n-octane, methylbenzene, dichlorotoluene, dichloromethane, trichlormethane, and pyridine.

3. The packaging method of high color gamut white light QD LEDs according to claim 1, wherein said red light QD phosphor powder and blue light QD phosphor powder are both selected from at least one of BaS, $AgInS_2$, NaCl, $Fe_2O_3$, $In_2O_3$, InAs, InN, InP, CdS, CdSe, CdTe, ZnS, ZnSe, ZnTe, GaAs, GaN, GaS, GaSe, InGaAs, MgS, MgSe, MgTe, PbS, PbSe, PbTe, Cd ($S_xSe_{1-x}$), $BaTiO_3$, $PbZrO_3$, $CsPbCl_3$, $CsPbBr_3$, and $CsPM_3$.

4. The packaging method of high color gamut white light QD LEDs according to claim 3, wherein the grain size of said red light QD phosphor powder and said blue light QD phosphor powder is 1 nm to 10 nm; the peak wavelength of the light emitted from said red light QD phosphor powder is 600 nm to 660 nm, and the peak wavelength of the light emitted from said blue light QD phosphor powder is 430 nm to 480 nm.

5. The packaging method of high color gamut white light QD LEDs according to claim 4, wherein said mixed packaging glue consists of packaging glue A and packaging glue B at a mass ratio of 1:1-20, and said packaging glue A and packaging glue B are both one of epoxy packaging glue, organic silicon packaging glue, and polyurethane packaging glue.

6. The packaging method of high color gamut white light QD LEDs according to claim 5, wherein said green light rare earth phosphor powder is selected from one of rare earth element doped silicate, aluminate, phosphate, nitride, and fluoride phosphor powders, the peak wavelength of the light emitted from said green light rare earth phosphor powder is 520 nm to 550 nm, and the peak wavelength of the light emitted from said ultraviolet chips is 230 nm to 395 nm.

7. The packaging method of high color gamut white light QD LEDs according to claim 6, wherein the frequency of the ultrasonic wave is 15 KHz to 120 KHz, the ultrasonic duration is 10 min to 90 min, and the water bath temperature during ultrasonic processing is 25° C. to 45° C. in step b; the baking temperature is 120° C. to 180° C., and the baking duration is 0.5 h to 6 h in step g.

8. The packaging method of high color gamut white light QD LEDs according to claim 7, wherein the mixing speed is 120 rpm to 350 rpm and the mixing duration is 5 min to 30 min in step d.

9. The packaging method of high color gamut white light QD LEDs according to claim 8, wherein the pressure in the deaerator during vacuum deaeration mixing is 0 KPa to 0.15 KPa, the mixing speed is 300 rpm to 1200 rpm, the deaeration temperature is 40° C. to 55° C., the deaeration duration is 30 min to 150 min in step e.

10. The packaging method of high color gamut white light QD LEDs according to claim 9, wherein the mixture is put into the deaerator and is mixed uniformly after a green light rare earth phosphor powder is added, the pressure in said deaerator is 0 KPa to 1.5 KPa, the mixing speed is 1100 rpm to 2000 rpm, the mixing duration is 3 min to 10 min, and the mixing temperature is 25° C. to 55° C. in step f.

\* \* \* \* \*